United States Patent [19]

Clube

[11] Patent Number: 5,187,372

[45] Date of Patent: Feb. 16, 1993

[54] APPARATUS FOR AND A METHOD OF TRANSVERSE POSITION MEASUREMENT IN PROXIMITY LITHOGRAPHIC SYSTEMS

[75] Inventor: Francis S. M. Clube, Neuchatel, Switzerland

[73] Assignee: Holtronic Technologies Ltd., Neuchatel, Switzerland

[21] Appl. No.: 774,519

[22] Filed: Oct. 8, 1991

[51] Int. Cl.$^5$ .......................................... G01N 21/86
[52] U.S. Cl. .................................. 250/548; 356/401
[58] Field of Search ............... 250/548, 557, 560, 561; 356/399, 400, 401

[56] References Cited

U.S. PATENT DOCUMENTS

| | | | |
|---|---|---|---|
| 4,311,389 | 1/1982 | Fay et al. | 356/400 |
| 4,496,241 | 1/1985 | Mayer | 250/548 |
| 4,779,001 | 10/1988 | Makosch | 250/548 |
| 4,814,626 | 3/1989 | Doemens et al. | 356/401 |
| 4,948,983 | 8/1990 | Maruyama et al. | 250/548 |
| 5,004,348 | 4/1991 | Magome | 250/548 |

Primary Examiner—David C. Nelms
Assistant Examiner—Stephone Allen

[57] ABSTRACT

Apparatus for transverse position measurement in a proximity lithographic system including a prism (10) having a glass plate (14) index matched beneath the prism on which a T.I.R. hologram (13) is pre-recorded. A laser source (12) provides a replay beam. A silicon wafer (16) is situated below the hologram and parallel therewith. A second laser source (17) produces through optics (18) a beam with gaussian intensity profile to generate a collimated strip of light (19) at the hologram plane. Elemental grating structures (20) are provided at different locations over the surface of the wafer. Detectors (22,24) collect parts of the lightfield resulting from the interaction of the laser beam with the grating structures. A piezo device (26) operated from a microprocessor (28) moves the silicon wafer in small increments in a direction substantially parallel to the hologram following measurements made by the two detectors which are processed by the micro-processor to produce an alignment signal for the piezo device.

21 Claims, 5 Drawing Sheets

APPARATUS FOR AND A METHOD OF TRANSVERSE POSITION MEASUREMENT IN PROXIMITY LITHOGRAPHIC SYSTEMS

The present invention relates to an apparatus for and a method of transverse position measurement in proximity lithographic systems and in particular to transverse position measurement in a T.I.R holographic imaging system in order to obtain high accuracy registration.

It relates generally to a method of position measurement in proximity lithographic systems, especially for the purpose of obtaining high accuracy registration.

Total internal reflection (T.I.R.) holograms are holograms which are made with either one or both of the object and reference beams totally internally reflected from the air/hologram interface. An article by K.A. Stetson, in Applied Physics Letters (June 1968), describes a method of T.I.R. holographic imaging. A holographic layer is index matched onto the hypotenuse surface of a right-angled prism to enable the reference beam to arrive at the hologram surface at an angle greater than the critical angle $\theta$ c. The object beam arrives through a semi-transparent object which is placed in close proximity above the hologram. The conjugate reconstruction beam produces the holographic image in the same place as the original object. British Patent Specification No. 2,193,344, which is based on the above prinicple described by Stetson discloses a specific application, namely a method of manufacturing an integrated circuit by means of the following basic steps:

a) providing a first recording medium which exhibits negligble scatter and high resolution without shrinking or distorting;

b) forming a volumetric holographic image of the circuit on the first recording medium by interference between an input beam of coherent light passing through a mask containing the integrated circuit, and a reference beam of coherent light which is totally internally reflected at the surface on which the recording medium is located;

c) replacing the mask by a silicon wafer having a second recording medium in order to reproduce the holographic image of the integrated circuit;

d) replaying the recorded volumetric holographic images by means of a second reference beam which travels in the reverse direction, the resulting interference between the hologram and the second reference beam causing an image of the mask to be formed on the second recording medium provided on the silicon wafer; and e) repeating the replaying operation a plurality of times with a plurality of silicon wafers.

In a development of the above method, the problem resulting from non-uniformity of the replay beam has been solved using a scanning technique as disclosed in our copending British Application No. 8902379.0. The system proposed in this application involves using a restricted or narrow reference beam which scans the holographic image on the first recording medium in order to build up an integrated circuit on the second recording medium provided on its silicon wafer.

A problem encountered in the application of the principle described by Stetson to the manufacture of integrated circuit arises from the plurality of images required for each circuit. These images need to be applied sequentially to build up the multilevel structure of the integrated circuit. Each image defines a region on the wafer surface that has to undergo a particular form of chemical processing such as etching, implantation or deposition, thereby enabling the various electrical functions within the circuit to be realised. For correct operation of the final device it is however essential that each of these layers be accurately aligned with respect to the others. Put quantitatively, the alignment between layers must be carried out to a value of about twenty per cent of the smallest feature size within the circuit; for example if the smallest feature size is a half micron, then registration must be carried out to a tenth micron. A further consideration is that some of the post-exposure treatments can cause non-uniform expansions or contractions across the wafer surface, distorting its shape, and therefore registration needs to be performed locally about the wafer area.

This requirement for good registration clearly applies whatever lithographic technique is being employed for circuit fabrication and the problem has already been addressed in other lithographic systems. The procedure in these systems is commonly achieved in stages; that is, a method or methods are employed for carrying out a coarse registration, or prealignment, of each new image with respect to the structure on the wafer, following which another method is applied to carry out the fine adjustment, reducing the misalignment by a factor of fifty or more. It is this latter stage which is particularly difficult to provide for, especially in fully automated, high throughput systems. The solutions to fine adjustment devised for such systems as optical steppers and x-ray lithographic equipment in many cases rely on grating structures. These sructures are chosen firstly because the harmonics of gratings are extremely well defined and secondly because of their relative immunity to local defects. The general procedure in these schemes is to use the main lithographic process to incorporate grating structures on the wafer surface alongside the circuit features, which then act as reference marks. Similar structures are incorporated at equivalent sites in the masks defining subsequent layers to be put down. Before the exposure of each new layer occurs, mask grating and wafer grating pairs are illuminated sequentially by a laser beam and a part or parts of the lightfield resulting from each interaction are detected. Processing the output of the detectors produces, for each grating pair, a signal corresponding to their relative offset in the direction of the particular grating vector; and so, from the signals from a set of grating pairs the translational and angular misalignment between mask and wafer can be determined and then adjustments made. In order that these signals can be reliably used to infer position they need to show a simple, smooth variation with degree of misalignment. This requires that the interaction of the laser beam with the gratings be as simple as possible. Together with the necessity for the wafer grating to be used in reflection this has led to particular grating techniques being adopted. In the optical stepper case, because it is in essence an imaging system, with a set of optics between mask and wafer, it is relatively straight-forward to interpose additional, alignment optics between the two. This is useful because it allows the laser illumination to be introduced or removed in this region thus enabling it to undergo a single interaction with each of a mask grating and a wafer grating, keeping the interaction simple and producing good quality alignment signals. One method based on this approach is disclosed in U.S. patent specification Ser. No. 4,779,001.

It so happens that this patent also mentions the possibility of using crossed gratings on the wafer surface, but this is simply so that a single wafer structure allows measurements to be made in two orthogonal directions: one linear grating component is used for the x direction and the other component for the y direction. In the x-ray system case, because it is a proximity printer, with the mask and wafer virtually in contact, it is not possible to introduce alignment optics between the two. The necessary simplification of the grating interaction is obtained by employing gratings of very fine period in order that only very few diffracted orders take part in the coupling process.

Neither of the above mentioned schemes however can be applied to the TIR holographic system. The first is prevented, as in the x-ray case, by the close proximity of the wafer and holographic layer, and the second by the problems faced in forming fine period, correctly referenced gratings in a relatively thick holographic layer.

It is therefore an object of the present invention to provide a method employing grating structures whereby an optical signal can be obtained from a proximity lithographic system, that accurately corresponds to the tranverse position in a particular direction of the mask with respect to the recording surface.

According to a first aspect of present invention there is provided apparatus for transverse position measurement in a proximity lithographic system including:

a) a mask lying above, parallel and in proximity to a recording surface;

b) a transmissive linear grating structure in the mask, the grating being accurately referenced with respect to other features in the mask;

c) a reflective crossed grating structure on the recording surface, the crossed grating being accurately referenced with respect to other structures on the recording surface, being sited underneath the grating in the mask, and with its orientation such that the grating vector of one of its components lies substantially parallel to the grating vector of the mask grating;

d) a laser source;

e) optical elements for providing collimated illumination of said grating structures from said laser source at or near normal incidence, the illumination being incident first on the grating in the mask;

f) means for detecting the reflected plus and minus first diffracted orders of a first orthogonal or set emanating from the interaction, the orthogonal order set being diffracted in a direction perpendicular to the grating vector of the mask grating, the geometry of the grating system and characteristics of the illumination beam being such that the light in the detected orders has substantially avoided the grating in the mask on its outward pass therethrough.

g) means for adjusting in small increments the relative positions of the mask and recording surface gratings, each position being with respect to the intersection of the line of the illumination beam and the respective grating surface and in the direction of the grating vector of the mask grating; and h) means for processing the outputs of the detecting means to generate an alignment signal corresponding to the relative positions of the mask and recording surface gratings.

According to a second aspect of the present invention there is provided a method of transverse position measurement in a proximity lithographic system including the steps of:

a) providing a mask lying above, parallel and in proximity to a recording surface;

b) incorporating a transmissive linear grating structure in the mask, the grating being accurately referenced with respect to other features in the mask;

c) incorporating a reflective crossed grating structure on the recording surface, the crossed grating being accurately referenced with respect to other structures on the recording surface, being sited below the grating in the mask and with its orientation such that the grating vector of one of its components lies substantially parallel to the grating vector of the mask grating;

d) illuminating said structures by a collimated laser beam at or near normal incidence, the illumination being incident first on the grating in the mask;

e) detecting the reflected plus and minus first diffracted orders of a first orthogonal order set emanating from the interaction, the orthogonal order set being diffracted in a direction perpendicular to the grating vector of the mask grating, the geometry of the grating system and characteristics of the illumination beam being such that the light in the detected orders has substantially avoided the grating in the mask on its outward pass there-through;

f) adjusting in small increments the relative positions of the mask and wafer gratings, each position being with respect to the intersection of the line of the illumination beam and the respective grating surface and in the direction of the grating vector of the mask grating; and g) processing the outputs of the detecting to generate an alignment signal corresponding to the relative positions of the mask and recording surface gratings.

The proximity lithographic system is preferably a T.I.R. holographic imaging system in which case said mask is a hologram supported on a prism.

Preferably, said method is used for obtaining registration between the holographic image and the structure on the wafer.

Registration can be performed in a number of ways, examples of which are:

a) Transverse position measurements in orthogonal directions are made at each of a plurality of sites over the complete wafer and hologram surfaces, and the measurements stored in the memory of a computer. The information is then used during the lithographic operation to make the necessary translational and rotational adjustments to ensure accurate registration.

b) In the case where the hologram is being scanned to build up the image on the wafer, the steps of transverse position measurement and positional adjustment to maintain registration are performed simultanously with the imaging process.

c) In the case of a step and repeat operation in which a hologram is being used to build up an image on a wafer of larger area, transverse position measurements are made at a plurality of sites over the hologram area and the corresponding part of the wafer area, these measurements then being used to perform registration prior to recording the hologram image onto that part of the wafer area. The above sequence is then repeated for another part of the wafer area.

The present invention will now be described in greater detail by way of example with reference to the accompanying drawings, wherein.

Figure 1:
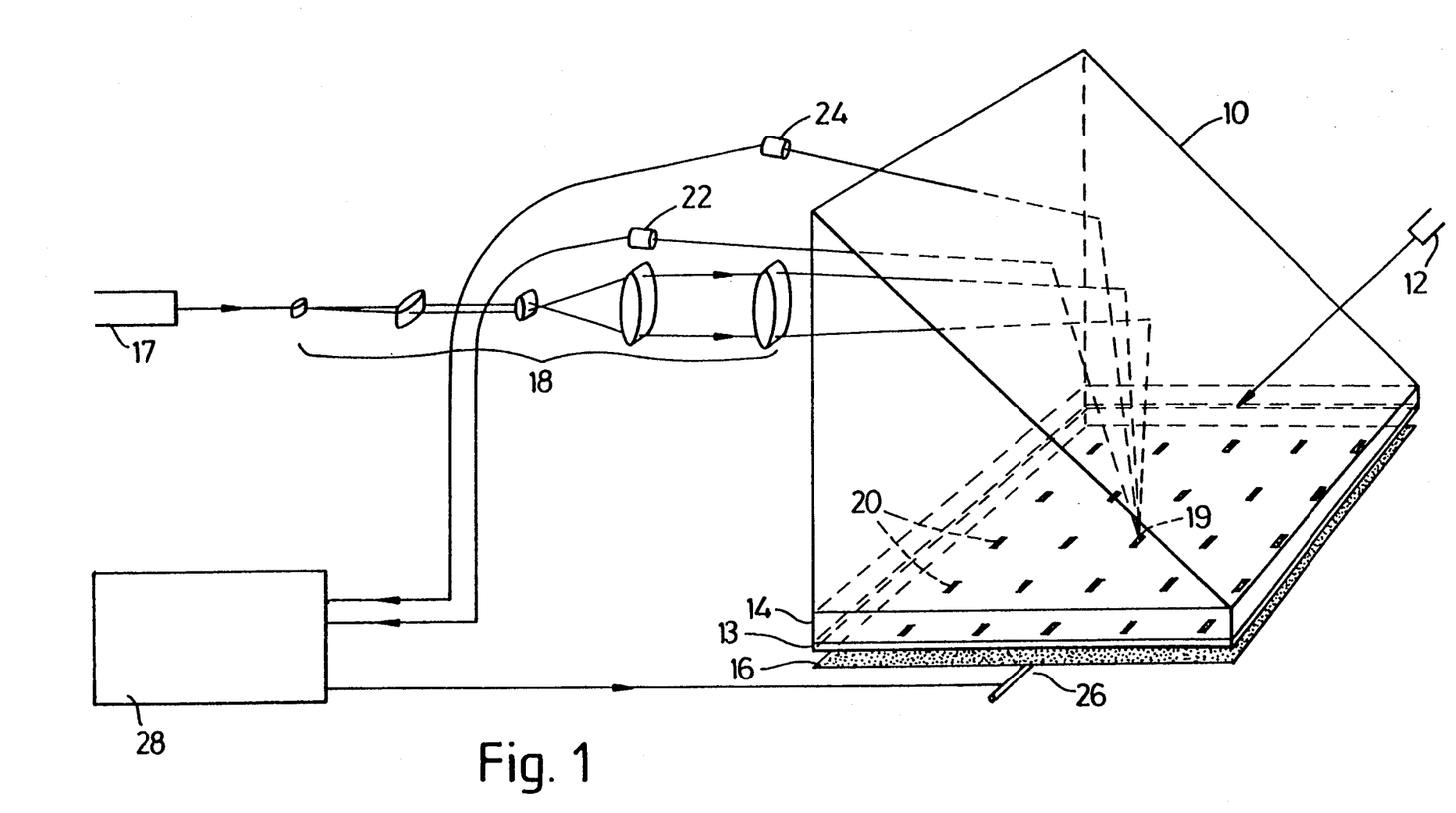
FIG. 1 is a diagrammatic representation of one preferred embodiment for measuring the relative transverse positions of hologram and wafer structure.

Referring now to FIG. 1, the reconstruction or replay beam is provided by a first laser source 12 directed through the diagonal surface of a prism 10 via optics (not shown). A prerecorded TIR hologram 13 is present on the lower surface of a glass plate 14 index matched beneath the prism 10. A silicon wafer 16 supporting a structure produced after partial application of a chip fabrication process is situated below the hologram and lying parallel to it, the latter having been obtained preferably by the method disclosed in prior Patent Application No. 8922341.6. A method or methods have also been used to coarsely align the wafer structure with respect to the hologram, resulting in a registration error of less than the period of the hologram alignment grating. Before illumination of the hologram occurs accurate measurement of the position of the hologram with respect to the wafer structure can be determined and adjustments made to bring the two into accurate correspondence. This may furthermore be carried out on a point by point basis thus compensating for any distortion of the wafer caused by earlier stages of the chip process. For this purpose a second laser source 17 emits in TEMoo mode, that is, producing a beam with gaussian intensity profile, and a set of cylindrical beam shaping optics 18, which together serve to generate a focussed and collimated strip of light 19 at the hologram plane, the beam having been directed through the vertical face of the prism and been reflected from its diagonal face so as to arrive at substantially normal incidence. Also provided are elemental grating structures 20 both at various locations over the surface of the wafer, preferably regularly spaced in the corridors between the chip areas, and at equivalent sites in the hologram. Two detectors 22 and 24, positioned off-axis with respect to the illumination beam, are situated to collect parts of the lightfield resulting from the interaction of the laser beam with the grating structures, the light having been reflected from the diagonal face before exiting the prism. In fact, two sets of optics are required, one to measure alignment in x and the other in y, but because the main principles for the two are the same only one set is included in the figure and considered from hereon. Also the scanning mechanics necessary for carrying out measurements over an extended wafer are again not important to the main principles involved so are likewise omitted from the figure and subsequent discussion.

The exact nature of these elemental gratings structures and their operation are now described in more detail.

Figure 2:
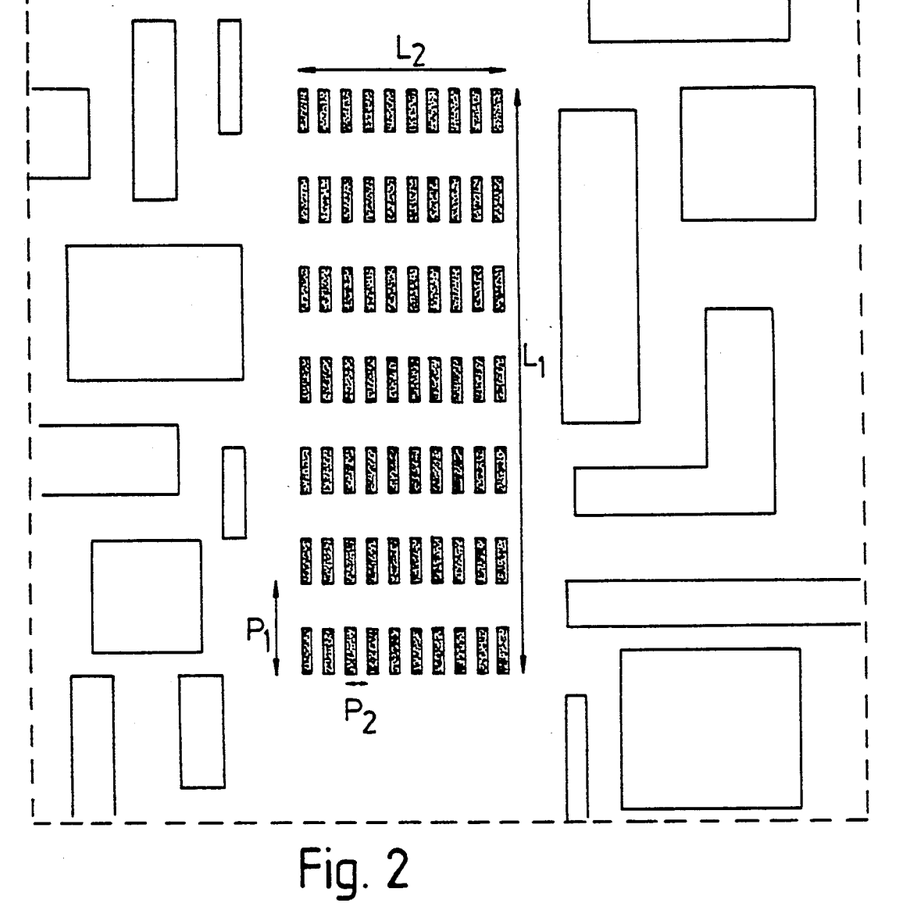
FIG. 2 is a diagrammatic representation of the grating structure incorporated on the wafer.
Figure 3:
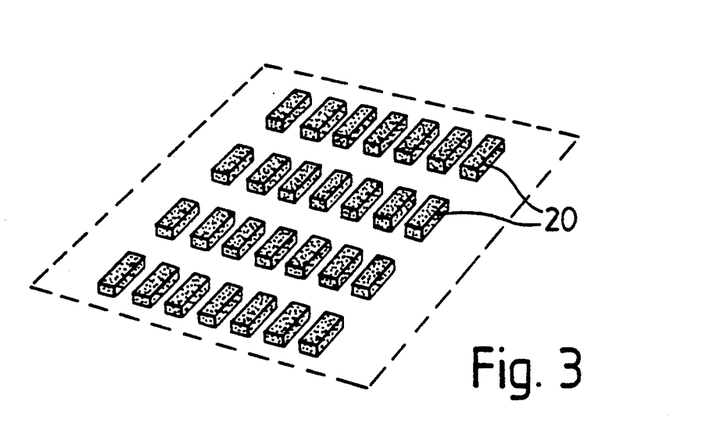
FIG. 3 is a perspective view of the grating structure on the wafer.

Referring to FIGS. 2 and 3 here are a schematic representation and a perspective view respectively of one of the grating structures laid down on the wafer as a reference mark. It may be described as a crossed grating and is essentially a composition of two linear gratings, and operates in reflection. The structure was formed using the TIR lithographic process having been defined in a mask alongside circuit features and thus accurately referenced with respect to them. The structure need not have been laid down in the immediately preceding layer but at an earlier stage of the process, in which case it may have been subjected to a number of coatings and its profile would not have the precise rectangular form shown in the diagram. Also not shown in the figure, because it again does not affect the principle of operation, is the layer of photosensitive material covering the complete wafer surface for receiving the next image. It should be stated that an equally viable structure is the inverse of that shown with the raised parts becoming recessed. The important aspects of the grating are its periods, P1 and especially P2 and its dimensions L1 and L2. The component with period P1 is hereafter referred to as the main grating component and the component with period P2 as the orthogonal grating component. The value of P1 should typically be of the order of one hundred times the accuracy the system needs to measure to; for example if a positional accuracy of 0.1 u is required, P1=10u would be a suitable value. The dimension L1 should be such that typically ten grating lines are present is this direction. So, with P1=10u, a typical value of L1 would be 100u. Typical values assigned to P2 and L2 which constitute the more critical parameters are discussed later.

Figure 4:
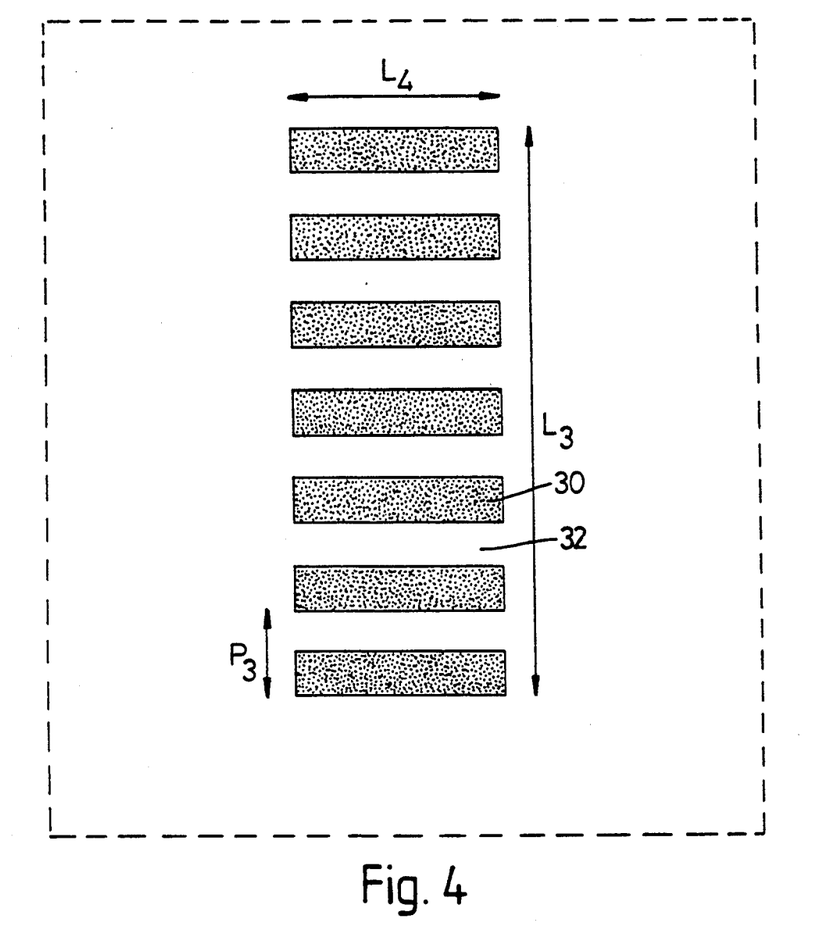
FIG. 4 shows the geometry of the grating structure incorporated in the hologram.
Figure 5:
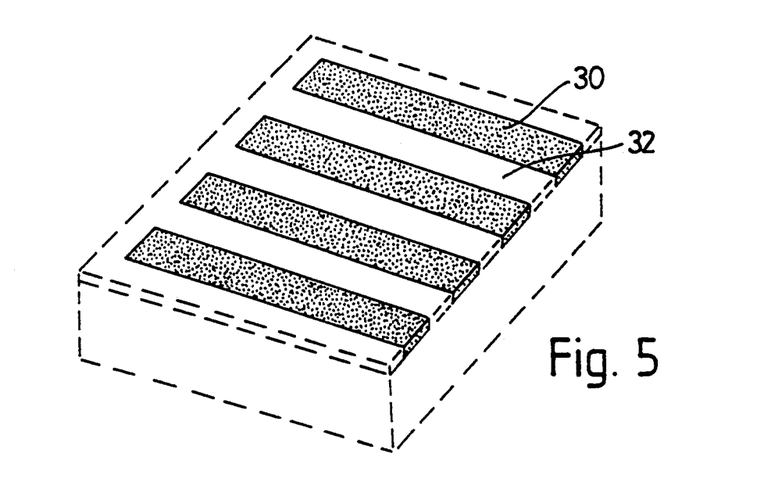
FIG. 5 is a diagrammatic representation of an example of the physical composition of the grating structure in the hologram.

Referring now to FIG. 4 here is shown the geometry of the grating structure incorporated within the hologram. In this case the grating is a linear transmissive structure and is accurately registered with respect to the image the hologram will reconstruct. The actual physical composition of the individual grating lines depends on the particular holographic recording material used but typically the material is a photopolymer and the lines represent regions of different refractive index. FIG. 5 illustrates this case. Preferably the refactive index difference between lines 30 and spaces 32 should be such that on illumination by the measurement laser beam the intensities of the first diffracted orders are as high as possible and also high compared to higher orders. Furthermore the ratio of the widths of the grating lines 30 to the widths of the spaces 32 should preferably be as close to unity as possible in order that the intensities of the even diffracted orders approach zero. The grating period P3 takes the same value as that of the main component of the wafer grating; so if P1=10u, P3=10u also. The grating,s length and width L3 and L4 respectively are discussed later. To facilitate explanation of the operation of the gratings in position measurement, it is necessary to say a few words about the diffractive properties of crossed gratings. As has already been mentioned a crossed grating is essentially a composition of two orthogonally orientated linear gratings and its diffractive properties are consistent with this description. Monochromatic light of wavelength λ normally incident on a linear grating of period, d, produces a set of diffraction orders, the direction, θn of the nth order being given by:

$$d \sin \theta n = n \lambda \quad \text{equ.(1)}$$

For a crossed grating with periods d1 and d2, sets of orders will be produced, the direction of the nth order in any one set with respect to the zeroth order of that set being given by:

$$d_1 \sin \theta n = n \lambda \quad \text{equ.(2)}$$

whilst the angle of the plane of the mth order set with respect to the incident beam is given by:

$$d_2 \sin \theta m = m \lambda \quad \text{equ.(3)}$$

Figure 6:
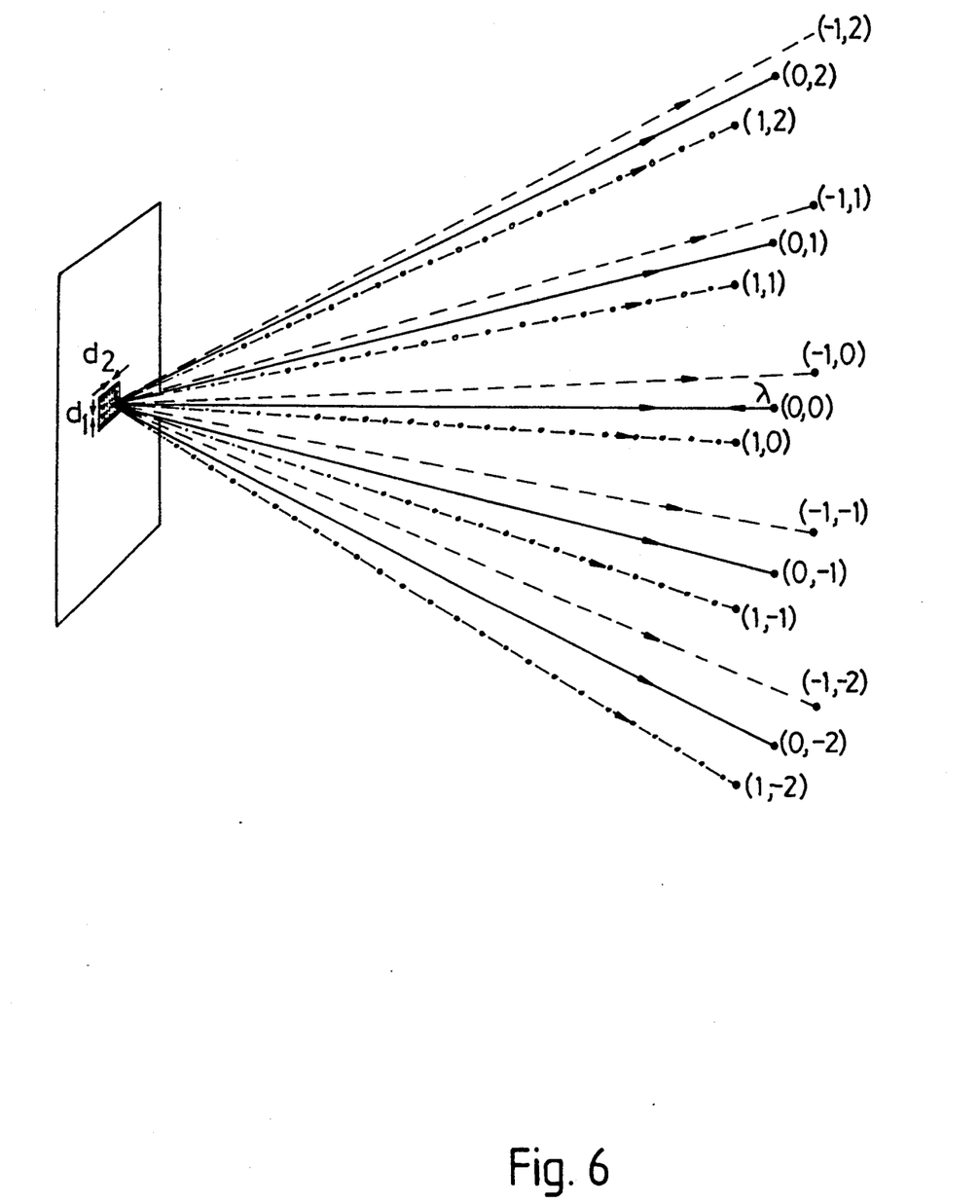
FIG. 6 illustrates the diffractive properties of a crossed grating.
Figure 7:
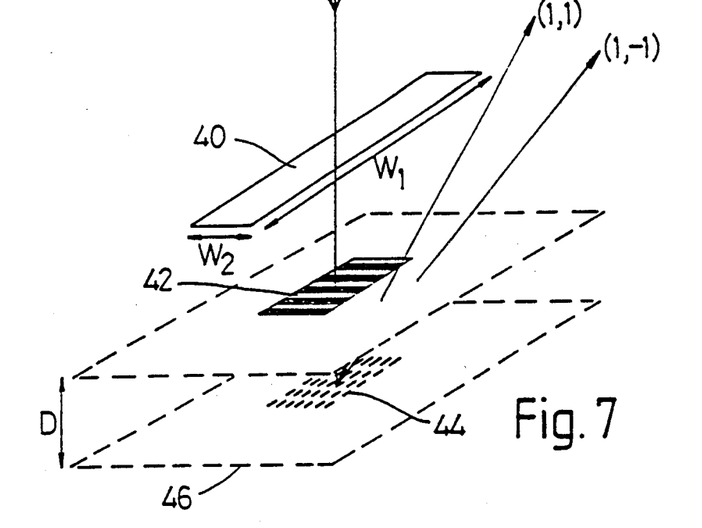
FIG. 7 is a schematic representation of the principle on which the present invention is based.
Figure 8:
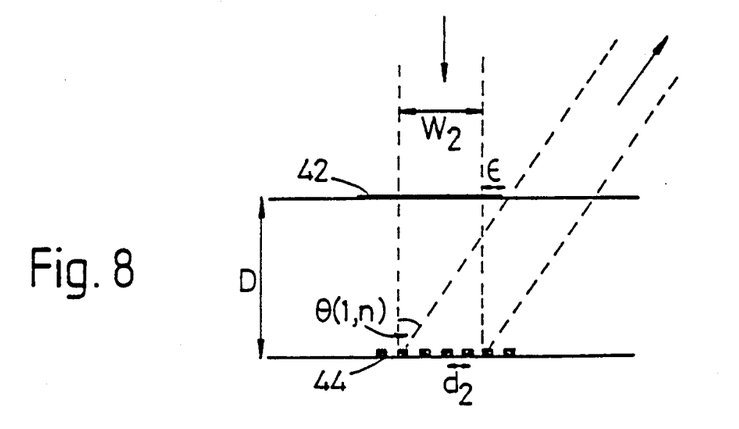
FIG. 8 is an end-on-view of the schematic representation shown in FIG. 7.

This is illustrated in FIG. 6 in which orders are shown for $-1 < m < 1$ and $-2 < n < 2$. A convention is hereby adopted in which for a crossed grating whose orthogonal component has been defined, the nth order in the mth orthogonal order set (associated with the orthogonal grating) is labelled the (m,n)th order. Returning now to the application of crossed gratings to position measurement, FIG. 7 shows the principle on which the system is based. A collimated, laser beam of transverse dimension W1×W2, generated preferably in the manner already described, illuminates at substantially normal incidence the holographic grating 42 whose relative orientation is such that its grating vector lies substantially parallel with beam dimension W1. The interaction of the beam with the hologram grating produces a set of diffracted orders which propagate towards the crossed grating 44 on the wafer 46, lying at a distance D from the hologram. A complex interaction takes place of the light with the two gratings 42 and 44, the gratings coupling light between the various diffracted orders, and the result is a set of reflected orders emerging from the system whose directions (but not intensities) are consistent with the beam having illuminated the crossed grating directly. Two of these orders, the plus and minus first orders of a first al order set, (1,1) and (1,−1) respectively, are collected by detectors. The important feature is that the laser beam parameters and the geometry of the gratings are such that the orders reaching the detectors substantially avoid the hologram grating on their outward pass through the holographic layer and so undergo essentially a single interaction with each of the gratings. This provides the necessary simplification to the coupling process, permitting the generation of a good quality alignment signal. From consideration of FIG. 8 in which is shown an end-on-view of the grating interaction, it can be seen that the above is true when the following conditions are satisfied:

$$\epsilon \geq 0 \quad \text{equ. (4)}$$

$$\theta_{(1,n)} \geq \tan^{-1}\left(\frac{W2 + \epsilon}{D}\right) \quad \text{equ. (5)}$$

where $\epsilon$ is the extension of the hologram grating beyond the edge of the illumination beam, as shown in the figure, and $\theta$ (1,n) is the diffraction angle of first orthogonal order set.

Since the direction of the first orthogonal order set is given by putting m=1 in equ. (3), the following relationship pertains between the various parameters $$\sin^{-1}\frac{\lambda}{P2} \geq \tan^{-1}\left(\frac{W2 + \epsilon}{D}\right) \quad \text{equ. (6)}$$

Preferably $\epsilon = 0$, that is the edge of the grating is at the edge of the beam, in which case $$\sin^{-1}\frac{\lambda}{P2} \geq \tan^{-1}\frac{W2}{D} \quad \text{equ. (7)}$$

This expression assumes constancy of beam width W1 as it propagates between the gratings which is usually a good approximation. However if Fresnel diffraction effects are more significant, that is the beam undergoes a slow divergence, then an additional correction term must be included in the expression. To give an example of typical values satisfying eqn (7), if the illumination wavelength is 633 nm and the hologram/wafer separation is 160 u, then a beam width of 50 u and an orthogonal period of 2u for the wafer grating will permit a well behaved alignment signal. In the preferred case where the illumination spot is generated in the manner described, from a laser beam with gaussian intensity profile, the dimensions of the spot should preferably correspond to twice the distance between the $1/e^2$ points of the beam.

Figure 9:
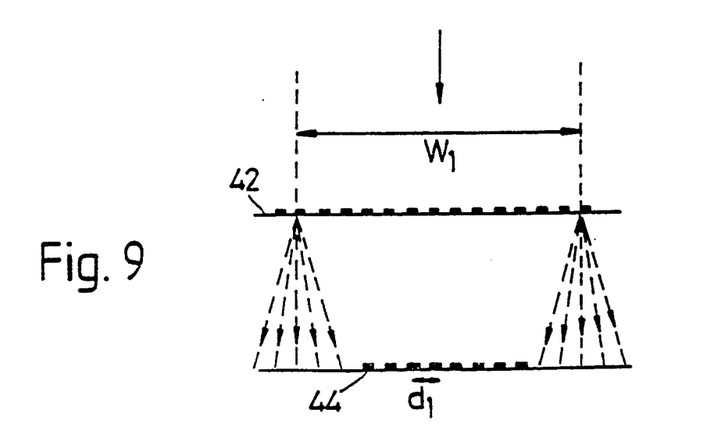
FIG. 9 is a side-on-view of the schematic representation shown in FIG. 7.

The widths L2 and L4 of the hologram and wafer gratings are such to maximise the amount of light taking part in the interaction. This is satisfied by L4 > W2 and L2 > W2, the latter assuming that the prealignment operation has substantially aligned the two gratings in this direction (and again assuming negligible Fresnel diffraction effects). The length L3 of the hologram grating is such that as many as possible of the diffracted orders falling on the wafer surface fully illuminate the wafer grating. This is illustrated in FIG. 9, showing a side-on-view of the grating interaction in which the dashed lines between hologram and wafer represent the edges of propagating orders. If n is the magnitude of the highest positive and negative diffracted order required to fully illuminate the wafer grating then the length of hologram grating required is given by:

$$L3 \geq L1 + 2D\tan\left\{\sin^{-1}\left(\frac{n\lambda}{P3}\right)\right\} \quad \text{equ. (8)}$$

In the preferred case of the even diffracted orders from the hologram having negligible intensity a typical value of n would be three.

The length W1 of the laser illumination is such to firstly maximise the amount of light taking part in the interaction and secondly to ensure that the illumination of the hologram grating be as uniform as possible in this dimension. With the preferred means of illumination, derived from a gaussian beam, the distance between the $1/e^2$ points of the beam in this direction should typically correspond to four times the length of the hologram grating.

Generation of signals corresponding to the relative positions of the hologram and wafer gratings may be performed in various ways of which two preferred examples are as follows:

Firstly referring again to FIG. 1, the wafer is translated in small, known increments by way of piezo device 26 or a stepping motor in a direction substantially parallel to the hologram grating vector over a range less than the grating period and within which registration in this direction is known to occur. After each incremental movement, readings at the two detectors 22 and 24 are taken and stored in the memory of a microprocessor 28. By reasons of symmetry it can be stated that when the two gratings are exactly aligned, that is when the lines of the main component of the wafer grating 44 are directly below the lines of the hologram grating 42, the intensities of the two detected orders must be the same. Therefore by carrying out a subtraction on the two sets of readings stored in the microprocessor 28 the position corresponding to alignment can be determined.

In the second example, the hologram and wafer remain static and the illumination beam is angularly scanned in small increments in a direction parallel to the hologram grating vector and in such a way that its position on the hologram remains substantially constant. Although not shown in FIG. 1, this may be achieved by arranging that the dimension W1 of the illumination spot be generated in the focal plane of an additional cylindrical lens and then translating a collimated beam across the aperture of this lens by way of a piezo device or stepping motor displacing a mirror. The range is such that the area of intersection of the beam with the hologram grating projected down the line of the beam scans across the wafer grating by a distance less that the grating period and in the direction of the hologram grating vector. As before detector readings are stored after each step and then a subtraction operation performed. In this case the null result corresponds to the gratings being symmetrically disposed about the line of the illumination beam thus through accurate knowledge of the beam direction, registration can be performed.

The separation of the hologram and wafer and the wavelength of the illumination are preferably adjusted so to optimize the behaviour of the alignment signal. In this case the laser 17 has means for adjusting the wavelength or alternatively a number of laser sources is provided emitting at different wavelengths and additional means are provided for adjusting the separation of the hologram and the wafer.

From the above description, it will be appreciated that the invention provides a transverse position measurement whereby a linear grating structure is incorporated within the holographic layer and a crossed grating structure on the wafer surface, the two then being illuminated by a focused, collimated laser beam of essentially rectangular cross-section, the grating geometry and beam parameters being such that the plus and minus first order of a first orthogonal order set emanating from the system have undergone essentially a single interaction with each of the hologram and wafer gratings. These orders, having been collected by detectors, are used to generate a signal corresponding to the relative positions of the two gratings.

In the claims, the term mask is used in a broad sense to cover other lithographic methods to the particular one described in which the mask constitutes a hologram.

I claim:

1. Apparatus for transverse position measurement in a proximity lithographic system including:
   (a) a mask lying above, parallel and in proximity to a recording surface;
   (b) a transmissive linear grating structure in the mask, the grating being accurately referenced with respect to other features in the mask;
   (c) a reflective crossed grating structure on the recording surface, the crossed grating being accurately referenced with respect to other structures on the recording surface, being sited underneath the grating in the mask, and with its orientation such that the grating vector of one of its components lies substantially parallel to the grating vector of the mask grating;
   (d) a laser source;
   (e) optical elements for providing collimated illumination of said grating structures from said laser source at or near normal incidence, the illumination incident first on the grating in the mask;
   (f) means for detecting the reflected plus and minus first diffracted orders of a first orthogonal order set emanating from the interaction, the orthogonal order set being diffracted in a direction perpendicular to the grating vector of the mask grating, the geometry of the grating system and charateristics of the illumination beam being such that the light in the detected orders has substantially avoided the grating in the mask on its outward pass therethrough;
   (g) means for adjusting in small increments the relative positions of the mask and recording surface gratings, each position being with respect to the intersection of the line of the illumination beam and the respective grating surface, and in the direction of the grating vector of the mask grating; and
   (h) means for processing the outputs of the detecting means to generate an alignment signal corresponding to the relative positions of the mask and recording surface gratings.

2. Apparatus according to claim 1, wherein said proximity lithographic system is an x-ray lithographic system.

3. Apparatus according to claim 1, wherein said proximity lithographic system is a T.I.R. holographic imaging system and said mask is a hologram supported on a prism.

4. Apparatus according to claim 3 wherein said prism has any geometry allowing the holographic replay beam to arrive at the hologram at an angle equal to or greater than the critical angle, allowing the beam for position measurement to illuminate the grating structures at or near normal incidence and allowing the plus and minus first first diffracted orders of a first orthogonal order set to be collected by detectors.

5. Apparatus according to any one of the preceding claims, wherein said laser source emits a beam in TEMoo mode that is, having a gaussian intensity profile and said optical elements include cylindrical beam shaping optics which focus the beam down to a collimated strip of light at the mask plane, the length of the strip lying substantially parallel to the grating vector of the mask grating.

6. Apparatus according to any one of the preceding claims 1-4, wherein means are provided for changing the wavelength of the laser illumination so as to optimize the alignment signal.

7. Apparatus according to claim 5, wherein means are provided for changing the wavelength of the laser illumination so as to optimize the alignment signal.

8. Apparatus according to any one of the claims 1-4, wherein means are provided to adjust the separation of the mask and the recording surface so as to optimize the alignment signal.

9. Apparatus according to claim 5, wherein means are provided to adjust the separation of the mask and the recording surface so as to optimize the alignment signal.

10. Apparatus according to claim 6, wherein means are provided to adjust the separation of the mask and the recording surface so as to optimize the alignment signal.

11. Apparatus according to claim 7, wherein means are provided to adjust the separation of the mask and the recording surface so as to optimize the alignment signal.

12. A method of transverse position measurement in a proximity lithographic system including the steps of:
(a) providing a mask lying above, parallel and in proximity to a recording surface;
(b) incorporating a transmissive linear grating structure in the mask, the grating being accurately referenced with respect to other features in the mask;
(c) incorporating a reflective crossed grating structure on the recording surface, the crossed grating being accurately referenced with respect to other structures on the recording surface, being sited below the grating in the mask and with its orientation such that the grating vector of one of its components lies substantially parallel to the grating vector of the mask grating;
(d) illumating said structures by a collimated laser beam at or near normal incidence, the illumination incident first on the grating in the mask;
(e) detecting the reflected plus and minus first diffracted orders of a first orthogonal order set emanating from the interaction, the orthogonal order set being diffracted in a direction perpendicular to the grating vector of the mask grating, the geometry of the grating system and characteristics of the illumination beam being such that the light in the detected orders has substantially avoided the grating in the mask on its outward pass there-through;
(f) adjusting in small increments the relative positions of the mask and recording surface gratings, each position being with respect to the intersection of the line of the illumination beam and the respective grating surface and in the direction of grating vector of the mask grating; and
(g) processing the outputs of the detection to generate an alignment signal corresponding to the relative positions of the mask and recording surface gratings.

13. The method according to claim 12, wherein said proximity lithographic system is an x-ray lithographic system.

14. The method according to claim 12, wherein said proximity lithographic system is a T.I.R. holographic imaging system and said mask is a hologram.

15. The method according to any of the preceding claims 12 to 14, wherein the wavelength of the laser illumination is such to optimise the alignment signal.

16. The method according to any of the claims 12 to 14, wherein the separation of mask and recording surface is such to optimize the alignment signal.

17. The method according to claim 15, wherein the separation of mask and recording surface is such to optimize the alignment signal.

18. The method according to any of the claims 12 to 14, whereby registration between the features on the mask and structures on the recording surface is obtained for the purpose of a lithographic process and irrespective of the end application, examples of which are integrated circuits, optical memory disks and flat panel displays.

19. The method according to claim 15, whereby registration between the features on the mask and structures on the recording surface is obtained for the purpose of a lithographic process and irrespective of the end application, examples of which are integrated circuits, optical memory disks and flat panel displays.

20. The method according to claim 16, whereby registration between the features on the mask and structures on the recording surface is obtained for the purpose of a lithographic process and irrespective of the end application, examples of which are integrated circuits, optical memory disks and flat panel displays.

21. The method according to claim 17, whereby registration between the features on the mask and structures on the recording surface is obtained for the purpose of a lithographic process and irrespective of the end application, examples of which are integrated circuits, optical memory disks and flat panel displays.

* * * * *